Aug. 1, 1967 P. J. W. JOCHEMS ETAL 3,333,997
METHOD OF MANUFACTURING SEMI-CONDUCTOR DEVICES
Filed Feb. 20, 1964 2 Sheets-Sheet 1

INVENTOR.
Pieter J.W. Jochems.
Reinier de Werdt.
Dirk de Nobel.
BY
Frank R. Jufari
AGENT INVENTOR.
Pieter J.W. Jochems.
Reinier de Werdt.
Dirk de Nobel.
BY
Frank R. Jifari
AGENT United States Patent Office 3,333,997
Patented Aug. 1, 1967

3,333,997
METHOD OF MANUFACTURING SEMI-CONDUCTOR DEVICES

Pieter Johannes Wilhelmus Jochems, Reinier de Werdt, and Dirk de Nobel, Emmasingel, Eindhoven, Netherlands, assignors to North American Philips Company, Inc., New York, N.Y., a corporation of Delaware Filed Feb. 20, 1964, Ser. No. 346,191
Claims priority, application Netherlands, Mar. 29, 1963, 290,930
8 Claims. (Cl. 148—177)

This invention relates to methods of manufacturing semi-conductor devices comprising a semi-conductor body, preferably of germanium or silicon, which possesses a p-type conductive layer recrystallized from an alloyed contact material and locally provided on a side of the body, said recrystallized layer being located, at least at the surface of the body, beside an n-type conductive layer which is obtained by diffusion of a donor into the body. The invention also relates to semi-conductor devices and special embodiments thereof as manufactured by the use of a method according to the invention.

The above-described structure of a semi-conductor body having a p-type conductive recrystallization layer and an n-type conductive diffusion layer which are located side by side is frequently used, for example, in so-called diffusion transistors.

Thus, for example, p-n-p type germanium transistors are known in which the n-type conductive diffusion layer constitutes the base zone of the transistor and is obtained by diffusion of a donor, for example arsenic, into a p-type conductive initial body. An alloy contact intended as the emitter contact is locally provided on the said n-type conductive diffusion layer by alloying an acceptor-containing contact material. A p-type conductive recrystallized zone is formed under the alloy contact upon cooling subsequent to the alloying process, which zone penetrates the n-type conductive layer only up to part of the depth of penetration thereof and thus adjoins the n-type conductive diffusion layer inter alia at the surface.

Also n-p-n type silicon transistors are already known which are manufactured by providing in an n-type conductive initial body, in succession or simultaneously, a p-type conductive diffusion layer and in the surface portion of the latter an n-type conductive diffusion layer. A base contact with the p-type conductive layer located at a greater depth, which is intended as the base zone, is obtained by alloying for a short time an acceptor-containing material in the form of an annulus on the n-type conductive layer which is intended, at least in part, as the emitter zone. The p-type conductive recrystallized layer under the said annular base contact penetrates through the n-type conductive layer into the p-type conductive base zone, thus surrounding a portion of the n-type conductive diffusion layer which is encircled by said annulus and fulfils the function of an emitter zone.

The contact material used in these cases is often aluminum which provides, because of its good solubility, a high emitter output in the p-n-p type transistor and a low resistance base connection in the n-p-n type transistor. The diffusion of the donor and the alloying of the acceptor are carried out successively in this sequence as separate treatments, inter alia because the temperature required for diffusion is much higher than that for alloying. Besides, the duration of the alloying process is so short that substantially no diffusion occurs.

However, it is also known for the manufacture of a p-n-p type germanium transistor to carry out the diffusion of the base zone simultaneously with the alloying of the acceptor. In this case the acceptor-containing material used is an alloy of lead or bismuth with at most a few percent of gallium or aluminum. During the alloying process a donor diffuses, for example from the ambience or from the alloy provided, through the melt into the underlying germanium and into the surface located next to the melt, thus constituting the n-type conductive base zone on which upon cooling a p-type conductive emitter zone with an associated contact recrystallizes due to the segregation of the acceptor. Since the melt has no inhibiting influence on the diffusion of the donor, n-type conductive diffusion layers are formed under the p-type conductive recrystallized layer and in the surface of the body located next to it, which diffusion layers adjoin one another and have the same thickness.

The known manufacturing methods above described suffer from several disadvantages and limitations. In fact, in order to obtain a reasonably high value for the breakdown voltage between the adjoining p-type and n-type conductive layers or even to avoid interfering "tunnel effects" and short-circuit, it is necessary for the concentration of donors or acceptors in one of the two layers, especially at the surface of the body, to be not higher than $10^{18}/cm.^3$ for germanium and at most $10^{19}$ for silicon. Since the concentration of the acceptors in the p-type conductive layer is difficult to influence, this usually means that the concentration of donors in the surface of the diffused layer cannot be made higher than the above-mentioned value. If such diffused layer serves as a base zone, as is the case in a p-n-p type transistor, this gives rise to a comparatively high resistance of the base of the transistor, which is undesirable especially for a broad frequency range and for high power, and a similar drawback occurs if the diffused layer fulfils the function of an emitter zone, as is the case in an n-p-n type transistor, because the specific resistance in the base zone must then be higher in view of the emitter efficiency. Higher concentrations would be permissible where necessary, but it is then necessary afterwards to etch to a great depth near the junction in order to prevent the two layers from adjoining each other. This again involves further complications and notably this deep etching gives rise to an increased resistance of the base. It has previously been suggested to decrease the base resistance by increasing the thickness of the portion of the diffusion layer located next to the recrystallized emitter zone by carrying out a separate pre-diffusion treatment, where after the resulting thick diffusion layer is locally removed and the thin base zone and the emitter zone are diffused into, and alloyed in, the cavity thus obtained. However, these additional treatments give rise to a further complication of the manufacturing technique. The above-described p-n-p type transistors as commonly employed in the case of germanium have the further disadvantage that it is extremely difficult reproducibly to provide a base contact at a very short distance from the emitter zone and this also has its repercussion on the base resistance obtainable and also on the collector capacity obtainable.

The present invention underlies inter alia recognition of the fact that new possibilities are created for manufacturing semi-conductor devices of the kind mentioned in the preamble and inter alia for improving one or more of the aforementioned disadvantages or limitations of the known methods if, according to the invention, the donor is diffused into the semi-conductor body at least to a considerable proportion while an alloy melt of an acceptor-containing contact material is locally present on the surface of the body, said alloy melt being capable of absorbing so large an amount of the donor that the diffusion of the donor from the front of the melt into the underlying body is delayed or checked at least to a considerable proportion in comparison with the simultaneous diffusion of the donor into a portion of the body located beside the melt. A contact material has been found very suitable in this connection which contains so high a concentration of aluminum that the diffusion through the front of the melt is considerably delayed or masked, the aluminum, especially in the case of germanium, having the further advantages that it also serves as an acceptor and this with a high segregation constant and that it has a low rate of diffusion along the surface.

The invention thus makes it possible to carry out the diffusion of the donor wholly or in part after providing the contact material and to make use of the delaying or completely masking action, the presence of the melt also ensuring a substantially uniform delay or masking over the surface. The contact material is chosen in connection with the desired delay or masking so that it can absorb or check a sufficient amount of donor, for example because it is capable, as is probably the case with aluminum, of forming a compound with the donor which is thus retained. Besides the delaying or masking action, such an alloy melt also has, as demonstrated for example with aluminum, a further very favourable activity which consists in that, especially when using a high surface concentration of the donor, for example from $10^{18}$ to $10^{20}/cm.^3$ in the case of germanium, a reasonable value for the breakdown voltage between the recrystallization layer and the diffusion layer can still be obtained and short-circuit and the like can be avoided. Obviously a transition layer having an effectively lower concentration of donor, which brings about the improvement of the transition, is formed through a short distance of, for example, about 1 micron in the surface directly adjoining the melt due to the absorbing and sucking action of the melt or otherwise due to interaction between the melt and the donor.

The delaying or masking action of the alloy melt depends not only upon the absorptive power of the melt, for example the concentration of the aluminum, the thickness of the layer, but also inter alia upon the duration of the diffusion and the temperature. The choice of said magnitudes depends upon the requirements to be imposed in a determined case with regard to the delaying or masking or forming of the transition layer and may be made by an expert in a simple manner, for example experimentally. Thus, for example, it is possible in germanium at a high surface concentration of $10^{19}$ to $10^{20}/cm.^3$ of donors, when using substantially aluminum as the contact material, to provide a 1 micron thick diffusion layer in the freely situated surface next to the melt without a perceptible diffusion of the donor taking place under the melt. The effect of the masking or delaying action is more distinct as the surface concentration of the donor is smaller and the duration of the diffusion is shorter.

The invention is especially used if, as is preferably the case, the donor is supplied to the surface of the semi-conductor body at least in part during diffusion from the ambience in the presence of the alloy melt, for example in the form of vapour from a donor source placed separately from the body, or diluted in an inert material provided on the body. If the donor is supplied simultaneously from the ambience it is possible to reach and maintain a high surface concentration in the surface next to the alloy melt, while surprisingly the alloy melt effectively delays or masks despite the possibility of supply from the ambience and can bring about a thin transition layer of decreased concentration in its direct vicinity. The donor intended for diffusion, after the alloy melt has been formed, is preferably supplied to the surface substantially from the ambience, especially if such diffusion is intended to convert the surface next to the melt from p-type conductivity into n-type conductivity. The diffusion treatment may thus be carried out in one step. However, without passing beyond the scope of the invention, it is also possible for the donor, at least in part, to be first incorporated in the surface by a pre-diffusion treatment, whereafter the contact material is alloyed on it, preferably through the said pre-diffused layer, and then the donor is diffused further into the body in the presence of the alloy melt. The donor is preferably still supplied from the ambience during the further diffusion, in order to maintain or increase the surface concentration of the pre-diffused layer. If the donor is supplied from the ambience in the presence of the melt with or without a pre-diffused layer, the diffusion will naturally always be considerable in the sense of the present application and the alloy melt is also sufficiently enabled to exert its absorbing and sucking action on the ambience. In the case of a pre-diffused layer without a supply of donor from the ambience during the further diffusion, a considerable diffusion in the presence of the melt is yet required to enable it to exert its absorbing and hence sucking action on its surroundings. A considerable diffusion is to be understood in this case to mean a diffusion of which the diffusion product $D \times t$, where D is the diffusion constant in $cm.^2/sec.$ of the relevant donor under the conditions prevailing and $t$ is the duration in seconds, is at least equal to $10^{-11}$ $cm.^2$. This method according to the invention is thus also clearly distinguished from known methods in which only short after-alloying is applied and substantially no diffusion can occur or is envisaged.

The term "considerable delay" in the sense of the present application is to be understood to mean that the depth of penetration of the donor from the front of the melt is at most ⅔ and preferably less than half of the simultantous increase of the depth of penetration in the portion of the body located next to the melt. When using aluminum, it is possible to vary the content thereof in the contact material to be alloyed within wide limits, provided this content is high enough in connection with the employed concentration of the donor and the duration of the treatment to provide the aforementioned minimum delay. In many cases a content of at least 10 atomic percent in the contact material before alloying already suffices to obtain a practical delay or masking. The content of aluminum in the contact material to be alloyed is preferably at leact 30 atomic percent and it is frequently most efficacious to use a contact material consisting substantially of aluminum, in which event a small amount of indium, for example up to 10 atomic percent, may advantageously be added to assist in uniform alloying. In addition to the advantages already referred to, a contact material consisting substantially of aluminum has the further advantage that it can readily be alloyed with the semi-conductor as a coherent layer and has a low resistance after the diffusion of donor, so that it is very suitable as a contact, and that it is greatly predominant in the recrystallized layer.

The acceptor-containing contact material, for example the aluminum-containing contact material previously referred to, may be deposited on the semi-conductor surface, for example by evaporation, and be alloyed on the semi-conductor at an elevated temperature prior to the diffusion treatment or at the diffusion temperature during the diffusion treatment. An additional advantage may be obtained, however, if the said acceptor-containing contact material is first alloyed on the semi-conductor at a temperature higher than that at which subsequently the diffusion of the donor is effected. Thus a thin p-type conductive recrystallization layer having in the case of aluminum a high concentration of aluminum may remain at the beginning of the diffusion before the front of the alloy melt, which layer may also assist in delaying or checking the diffusion of donor through the front of the melt and/or eliminating by compensation any parasitic diffusion of donor. In the case of germanium it has been found advantageous, for example, first to alloy the aluminum-containing contact material at at least about 700° C. and to carry out the diffusion of the donor at a lower temperature comprised between about 600° C. and 700° C.

Now several special embodiments of the method according to the invention will be described in which a special use is made of the retarding, masking and/or sucking action. If desired, the afore-described embodiments and more particularly the preferred embodiments can be combined with the methods to be described hereinafter, unless the contrary is expressly stated.

Although the invention may be used, for example, to form locally with the alloy melt only a mask against diffusion of donor, whereafter the alloy melt or the recrystallization layer and metal layer deposited therefrom and removed, the invention is more important for the manufacture of semi-conductor devices in which at least the recrystallized zone, preferably together with the contact layer deposited thereon from the alloy melt, and the diffusion layer form part of the semi-conductor device, for example a diode, a transistor or a p-n-p-n type structure and in which, to this end, said layers are each provided with a supply conductor and are preferably intended to be used with respect to each other substantially only in the forward direction. In fact, in this case, the special properties of the transition between the two layers which are obtainable with the invention, especially when using high surface concentrations, also become manifest in the semi-conductor device itself. The supply conductor intended for the recrystallization layer may be secured to the contact layer deposited from the alloy melt, said contact layer forming a connection of low resistance because of its metallic conduction. However, it is also possible, after using the method according to the invention and before providing the supply conductor, to remove the metallic layer wholly or in part and to attach the supply conductor to the p-type conductive recrystallization layer, for example by "pressure bonding." The high concentration of aluminum in the recrystallization layer then still permits the obtainment of a low-resistance connection. The invention is especially important for manufacturing a transistor in which an emitter zone and a surface zone of the base layer adjoin each other at the surface of the body on one side thereof. According to the invention, in this case, one of said two zones is obtained by the said diffusion of donor and the other zone by recrystallization from the said alloy melt. Special embodiments thereof, together with their advantages, will be described more fully hereinafter.

The possibility of obtaining a delayed diffusion of the donor under the front of the melt may be utilized very efficaciously in the manufacture of a p-n-p type transistor in which the p-type conductive recrystallization layer forms part of the emitter zone which is locally present in the surface of an n-type conductive diffused base zone. According to the invention, to this end, the donor intended for the formation of the base zone is diffused into the semi-conductor body, preferably from the ambience into the semi-conductor surface, while the said alloy melt for forming the emitter zone is locally present on a surface portion of the body and, due to the delay in the diffusion of the donor under the alloy melt, the donor is diffused into a portion of the body next to the melt to a considerably greater depth than under the front of the melt so as to form a thin n-type conductive portion of the base zone under the alloy melt and an adjoining thicker n-type conductive portion of the base zone in a portion of the body located next to the melt, whereafter upon cooling a p-type conductive recrystallization layer belonging to the emitter zone and an emitter contact are deposited from the melt. Consequently, due to the delay, a base zone having a small thickness under the emitter zone and a considerably greater thickness and a correspondingly lower resistance of the base next to this emitter zone is obtained without any additional treatment. The base contact is provided on the thicker portion, if desired during the same diffusion treatment.

Another important embodiment of the method according to the invention is based on the possibility of almost completely masking against diffusion of donor. According to the invention, in this case, a donor is diffused into the portion of the body located next to the alloy melt, whereas the diffusion of donor under the front of the melt is checked almost completely by the masking action.

When using the method according to the invention or the special embodiments thereof which have been described hereinbefore or will be described hereinafter, in which use is made of the delaying or masking action, one preferably utilizes the possibility of diffusing the donor into the semi-conductor body in the presence of the said alloy melt at a surface concentration of at least $3\times10^{18}/\text{cm.}^3$, preferably greater than $10^{19}/\text{cm.}^3$. Such a high concentration of donor may be obtained in known manner, for example by suitable choice of the vapour pressure of the donor or a compound thereof in the vicinity. Thus, a further decrease in the resistance of the diffusion layer becomes possible, which means a reduced resistance of the base, for example in the case of a diffused base layer, and an improved emitter output in the case of a diffused emitter zone. Despite the fact that a recrystallization layer having a high surface concentration and a metallic contact are also separated thereafter from the alloy melt, tunnel effects and short-circuit between the two layers are substantially avoided due to the sucking action of the melt and a value for the breakdown voltage is obtained which is surprisingly favourable under the conditions prevailing, for example from about 0.2 to 0.4 volt in the case of germanium. These values for the breakdown voltage are already suitable in themselves for many uses of a semi-conductor device in which these layers are relatively operated substantially in the forward direction, as is the case with an emitter zone and a base zone of a transistor, so that it is already sufficient to carry out, where necessary, a light after-etching treatment whereby any residues of metal are removed from the surface. However, for uses requiring a higher breakdown voltage, it is also possible to use a less high surface concentration or further to improve said value for the breakdown voltage, which is already reasonable in itself, in a simple manner by superficial etching. The fact that the melt lies at the surface or when projecting above it makes possible diffusion of the donor over the surface to the melt probably also adds to a considerable extent to this surprising effect which is probably attributable to the sucking action of the melt, whilst discharge of the donor is also possible in a simple manner within the melt from its edge to the centre. Consequently, the concentration of donor may be maintained low in the vicinity of the melt at a short distance, for example about 1 micron therefrom.

The invention has also been found very efficacious for the manufacture of n-p-n type transistors. According to the invention, to this end, the said acceptor-containing contact material is provided on a semi-conductor body, which contains a p-type conductive layer, intended as the base zone, on an n-type conductive region of the body, intended as the collector zone, on that side of the body under which the p-type conductive layer is situated, and an n-type conductive layer, intended as the emitter zone, is formed by diffusion of a donor into at least a portion of the p-type conductive layer located next to the contact material, whilst during this diffusion, or at least during a considerable proportion thereof, the said acceptor-containing contact material in the molten state locally constitutes a substantially complete mask against the diffusion of the donor, whereafter upon cooling a thin p-type conductive recrystallization layer and preferably an associated contact as an ohmic connection with the base layer are deposited from the melt. The donor is diffused into the p-type conductive surface preferably from the ambience in the presence of the melt, although a pre-diffusion treatment under the conditions previously described is possible in certain cases. If desired, the diffused emitter zone may be limited afterwards to a portion of the surface, for example by means of an etching treatment known per se. The said acceptor-containing contact material is preferably so provided as to surround a freely situated portion of the surface, for example in the form of an annular, eliptic or line-shape contact extending along the periphery of a rectangle, an emitter zone being formed during the diffusion of the donor at least in the surrounded free surface portion of the body. The base contact thus formed surrounds the emitter zone at a distance which is very short and reproducible in a simple manner, so that difficulties in providing the base contact are avoided and a low resistance of the base becomes possible. Portions of the n-type conductive diffusion layer formed outside the base contact or, if necessary, portions of the base contact itself, together with the underlying semi-conductor, may be removed afterwards, for example by etching. Due to the masking action of the alloy melt, the diffusion of the emitter zone may be carried out while alloying the base contact. In this embodiment the diffusion of the donor in the presence of the alloy melt is preferably also carried out at a surface concentration of the donor of at least $3\times10^{18}/\text{cm.}^3$, preferably higher than $10^{19}/\text{cm.}^3$, so that a high output of the emitter and a low resistance of the base become possible and a transition layer of decreased effective concentration of donor over a distance of, say, about 1 micron may be formed between the base contact and the emitter zone, automatically and in a reproducible manner, which transition layer is sufficient to avoid short-circuit, tunnel effects and the like and to obtain a reasonable breakdown voltage. Such a structure is very suitable for transistors having a large range of frequencies, for example from 500 to 1000 mHz., and for power transistors. To obtain a favourable breakdown voltage of the collector, the n-type conductive zone in the initial body preferably passes into the p-type conductive layer through an intermediate layer having a lower concentration of donor. Such an initial body may be manufactured in a simple and efficacious manner by producing a p-type conductive layer in an n-type conductive body containing a rapidly-diffusing donor which determines the conductivity such, for example, as antimony in the case of germanium, by diffusion of a slowly-diffusing acceptor, preferably indium, so that a transition layer having a decreased effective concentration of donor is formed at the same time as the indium diffuses into and the donor diffuses out of the body. In another suitable embodiment the initial body is obtained by applying to an n-type conductive substrate, by epitaxial means from the vapour phase, an n-type conductive layer having a comparatively low concentration of donor and on this the p-type conductive layer which may also be grown from the vapour phase or may be applied by diffusion of an acceptor into a portion of the n-type conductive layer.

The sucking and masking action may also be utilized very efficaciously in the manufacture of semi-conductor devices in which a p-type conductive recrystallization layer is locally present in the surface of an n-type conductive layer, for example diffusion layer, as is the case, for example, in a p-n-p type diffusion transistor in which the n-type conductive diffusion layer constitutes the base zone and the p-type conductive recrystallization layer constitutes the emitter zone. According to the invention, such a semi-conductor device may advantageously be manufactured by first providing an n-type conductive layer on a p-type conductive initial body in a manner known per se for example by diffusion, and locally providing on this layer the said acceptor-containing contact material for forming a p-type conductive recrystallization layer in a surface portion of the n-type conductive layer, whereafter diffusion of a donor from the ambience into the surface is carried out whereby the concentration of the donor in the surface of the n-type conductive layer next to the melt is increased to at least $3\times10^{18}/\text{cm.}^3$ preferably to a concentration higher than $10^{19}/\text{cm.}^3$. It is thus possible initially to use a lower surface concentration in the n-type conductive layer, which may be desirable in view of the desired distribution of the concentration under the recrystallization layer in the base zone, and thereafter still to combine, due to the masking and sucking action, the advantages of a high surface conduction whilst retaining a favourable breakdown voltage and avoiding short-circuit and tunnel effects.

The invention has been found efficacious especially for the manufacture of a semi-conductor device having a semi-conductor body of germanium, although it has previously been demonstrated that the retarding or masking action of such an alloy melt may also be utilized in the case of silicon. The aforementioned high values for the surface concentration with the improvement in breakdown voltage are especially obtainable with germanium. Antimony an arsenic have been found to be suitable donors in the case of germanium, especially arsenic because of the very high surface concentrations obtainable therewith.

In order that the invention may be readily carried into effect, a few special embodiments thereof will now be described in detail, by way of example, with reference to several more detailed examples shown in the accompanying diagrammatic drawings, in which.

Figure 1:
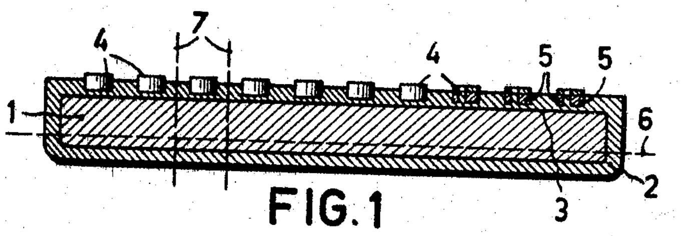
FIGURES 1, 3, 4, 5 and 6 show in cross-section successive stages of a semi-conductor body in manufacturing an n-p-n transistor according to the invention.

In the manufacture, according to the invention, of n-p-n type germanium transistors for high frequencies start is made from, for example, an n-type conductive germanium plate having a specific resistance of about 0.5 ohm-cm. and dimensions of, for example, 10 mm. x 10 mm. x 100 micron, so that 100 such transistors can be manufactured thereon at the same time. The plate contains, as a conductivity-type determining impurity, antimony in a concentration of about $3\times10^{15}/\text{cm.}^3$, which rapidly diffuses into germanium.

An approximately 1.6 micron thick p-type conductive layer 2 is diffused into said n-type conductive plate 1 (see FIGURE 1) by heating the plate, together with a supply of In-Ge alloy (in about 60 atomic percent) for about 2 hours in an atmosphere of hydrogen at about 800° C. Since indium is an impurity which diffuses slowly the time available for the rapidly-diffusing antimony is sufficient for also diffusing out, so that the p-type conductive layer 2, intended as the base zone, passes through a p-n type transition 3 into an n-type conductive junction layer having a decreased effective concentration of donor inter alia due to the compensation in the initial n-type conductive interior of the body which is intended as the collector zone. Even more favourable is a $p\text{-}n^{-}\text{-}n^{+}$ transition from the base zone to the collector, which is aimed at for obtaining a low capacity of the collector and a low resistance of the collector if these are manufactured by epitaxial growth from the vapour phase on an n-type conductive substrate or by a combination of growth and diffusion as previously stated in the preamble.

100 small rings 4 consisting substantially only of aluminum are now evaporation deposited via a mask in the usual manner on the upper side of the plate, evenly divided in 10 rows each of 10 with a spacing of about 0.9 mm. FIGURE 1 shows a cross-section of the plate at a row of 10 rings. The plate is now heated for about 1 minute in an atmosphere of hydrogen at about 730° C. in order to alloy the rings 4 in the plate, during which process p-type conductive recrystallization layers 5 are formed under the rings 4. Subsequently the upper side of the plate is covered with a protective mask layer of wax and an approximately 5 micron thick layer (including the layer 2 at the lower side) is etched away at the underside along the dashed line 6 in an etching bath composed of 10 parts by volume of HF (50%), 14 parts by volume of $HNO_3$ (65%), 1 part by volume of $H_2O$ and 0.5 part by volume of alcohol.

Figure 2:
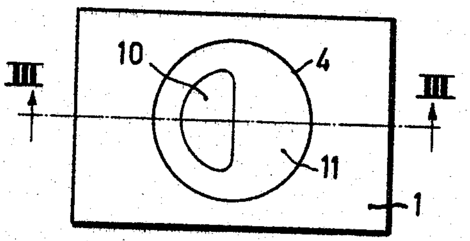
FIGURE 2 is a plan view on the semi-conductor body of FIGURE 3.
Figure 3:
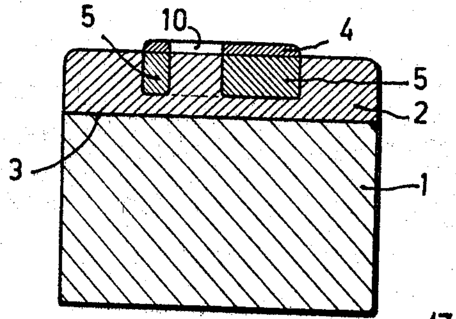

The foregoing may be explained more fully with reference to FIGURES 2 and 3 showing in plan view and in cross-section, respectively, a portion of the plate of FIGURE 1, namely that which is present between the dashed lines 7 and corresponds to one ultimate transistor, in greater detail and on a larger scale. For the sake of simplicity and clarity of the drawing, only the treatment of this portion of the plate 1 will be shown in the further FIGURES 4 to 6 since the treatment of the other 99 portions takes place simultaneously (at least up to and including FIGURE 5) and in the same manner.

FIGURE 2 shows more clearly in plan view the shape of the ring 4 which possesses and surrounds a cavity 10 which is positioned asymmetrically relative to the ring and leaves free a surface area of the p-type conductive layer 2. The ring has an external diameter of about 60 microns and the shape of the cavity 10 approximately corresponds to that of a half circle which has the same centre as the circumference of the ring and a radius of about 20 microns. This elongated shape of the cavity affords the additional advantage of a favourable combination of a low resistance of the base and a low capacity of the collector and still permits simple contacting. The evaporation-deposited ring, prior to alloying, has a thickness of about 0.4 micron. After alloying, a recrystallization layer 5 has been formed having substantially the same shape as the ring 4. This recrystallization layer 5, which has a high p-type conductivity because of its aluminum content, penetrates the plate up to a small distance from the p-n transition 3. If the specific resistance of the n-type conductive layer 1 is not unduly low or no high requirements are imposed on the capacity of the collector, the recrystallization layer 5 may also penetrate, if desired, as far as into the n-type conductive layer.

During the evaporation-deposition, the ring 4 preferably consists substantially of aluminum and a content of indium, for example 6% by volume. The indium is preferably first deposited and then the aluminum. The addition of indium enhances uniform alloying with the germanium.

Figure 4:
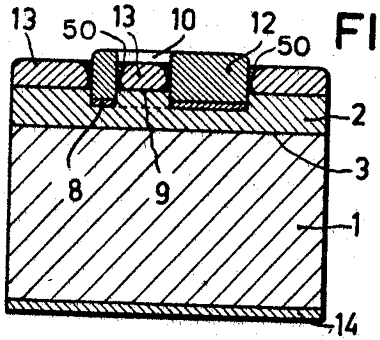

During the subsequent important phase of the manufacture an n-type conductive emitter zone is produced, by diffusion of a donor, in a surface area adjoining the aluminum ring 4, more particularly in the present example also in the free surface within the cavity 10. To this end, the plate is heated for about 9 minutes in an atmosphere of hydrogen at 650° C. while adding at the same time arsenic vapour from a space connected to the oven, in which an amount of arsenic is heated to about 440° C. During this process the ring 4 and the recrystallization layer 5 of FIGURE 3 again largely assume the molten state and constitute, as shown in FIGURE 4, the aluminum-containing melt 12 which locally delays and almost completely masks the diffusion of arsenic. Since the diffusion temperature is lower than the temperature at which alloying took place, a thin p-type conductive recrystallization layer 8 may remain behind before the front of the melt, which layer can add to the masking effect and compensate for any parasitic diffusion of arsenic. An n-type conductive layer 13 is formed, due to the diffusion of arsenic, in the surface located next to the melt both inside the cavity 10 and outside the melt 12. An n-type conductive layer 14 is also formed at the underside and may be used afterwards for providing an ohmic contact on the underside.

The heating of the arsenic to 440° C. permits of obtaining a high surface concentration of the donor, for example about $7\times10^{19}/cm.^3$. The n-type conductive layers 13 and 14 are each about 0.6 micron thick. After cooling, the p-type conductive recrystallization layer 5 and the contact 4 are deposited, as before, from the melt 12 of FIGURE 4 (see FIGURE 5) so that a highly doped p-type conductive recrystallization layer 5 with its contact 4 is located at the surface of the body next to a highly doped surface portion of the n-type conductive diffusion layer 13. Nevertheless it has been found that short-circuit and interfering tunnel effects may be avoided and a breakdown voltage favourable for an emitter transition is reached, namely from 0.3 to 0.4 volt, which may be called surprising. During diffusion, the melt has evidently sucked away the arsenic, at least in part, through a short distance of about 1 micron, so that a layer of a lower doping may have been formed between the two layers 13 and (5, 4).

Figure 5:
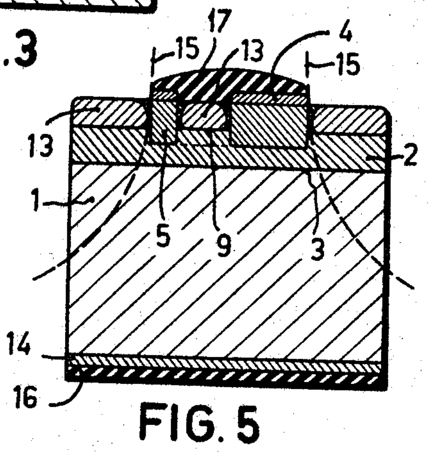
Figure 6:
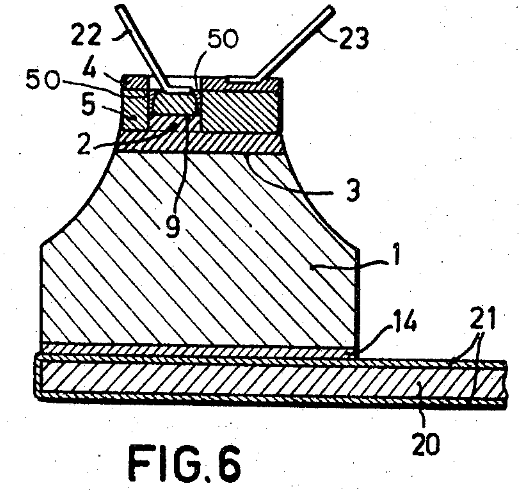

So in FIGURES 4 to 6 it is shown that the emitter transition 9 intersects the semiconductor surface at a short distance from the melt 12 and from the base-contact ring 4, indications of which have also been found on a cross-section made of a larger design of such a configuration. The sucking action of the melt 12 may evidently be so intense that the concentration of donor is so much decreased through said distance that a thin p-type conductive layer remains from the initial layer 2 between the melt and the n-type conductive diffusion layer. So great a decrease in the concentration of donor, although preferably aimed at, is not necessary, however, since an improvement in the breakdown voltage is, of course, obtained even when the n-type conductive diffusion layer 13 of decreased concentration of donor adjoins the recrystallization layer 5 and the base contact 4.

The portions of the n-type conductive layer 13 and of the p-type conductive layer 14 located externally of the ring 4 are then removed by etching along the dashed lines 15. To this end, the underside of the plate is masked with the aid of a non-corrosive wax layer 16 and at the upper side of the plate a masking layer 17 is also provided on the rings 4 and the cavity 10, which may be effected, for example, by a photographic means or by evaporation-deposition through a mask in a manner known per se. The assembly is then submerged in an etching bath composed of 10 parts by volume of HF (50%), 14 parts by volume of $HNO_3$ (65%), 1 part by volume of $H_2O$ and 0.5 part by volume of alcohol until about 5 microns are etched away from the upper side along the dashed lines 15, whereafter the masking layers 16 and 17 are dissolved and removed.

Hitherto the whole of the plate shown in FIGURE 1 has undergone the same treatment. Now the plate 1 is divided by scratching and breaking into the 100 individual transistors. The lower side of each transistor (see FIGURE 6) is soldered at about 500° C. on a fernico-carrier 20 covered with a gold layer 21.

The ring 4 and the recrystallized zone 5, which serve as an ohmic connection of the base, surround the emitter zone 13 at a distance which is very short and automatically reproducible, so that difficulties in providing a base contact at a short distance from the emitter zone are already avoided. Au-wires 22 and 23 each about 7 microns thick are now provided on the emitter zone 13 and on the broad side of ring 14, respectively, with the aid of a sapphire chisel in known manner by means of "pressure bonding." Next the assembly is lightly etched at 40° C. in a weak etching agent consisting of 10% $H_2O_2$, in order to remove any metal residues from the surface.

The transistor is now ready to be mounted in the usual manner in an envelope. Such p-n-p type transistor has been found to have exceptionally good properties inter alia due to the use of the invention, whilst the manufacture is still simple and reproducible due to the use of the invention. Thus, the gain factor of such a transistor at 800 mc./s. is still 13 to 16 db and the breakdown voltage of the emitter is 0.25 volt. The cut-off frequency is, for example, higher than 2000 mc./s. or even higher. The noise factor may also be exceptionally low, namely from 5 to 6 db, which is an indication of the occurrence of a very low resistance of the base, namely about 25 to 50 ohm-cm., at the given small thickness of 1 micron for the base zone.

An efficacious masking or delay may also be obtained if the diffusion temperature is equal to or higher than the temperature at which the previous alloying process takes place, and the depth of penetration of the diffusion layer may even be greater than that of the front of the melt, whilst masking also takes place efficaciously under the front of the melt. This may be demonstrated with, for example, the following experiments in which an aluminum-indium ring having an external diameter of about 30 microns and an internal diameter of 20 microns and otherwise the same composition and thickness as specified the preceding example is first alloyed for 1 minute at 700° C. on a p-type conductive germanium plate having a specific resistance of about 0.5 ohm-cm. After diffusion of arsenic for 10 minutes at 700° C. at the same surface concentration as specified in the preceding example, the front of the alloy melt, and hence after cooling also the p-type conductive recrystallization layer, has penetrated the plate through about 1.3 microns, whilst an n-type conductive layer about 2.2 microns thick has been formed next to the melt without any diffusion of donor under the front of the melt or, after cooling, under the recrystallization layer formed therefrom being perceptible. With a diffusion of arsenic for 10 minutes at 750° C. under otherwise similar conditions the front of the melt and the recrystallization layer have penetrated the plate through 1.5 to 2 microns, whilst an n-type conductive layer of about 4.5 microns thick has been formed next to the melt without any diffusion under the front of the melt or under the recrystallization layer. In either case the breakdown voltage between the contact material and the n-type conductive diffusion layer, after light etching, is about 0.3 volt.

From the following experiments it may appear that suitable contact materials are not only those which consist, at least substantially, of aluminum.

Thus, for example, contact material layers consisting of aluminum-gold-nickel (0.1 micron of Al, 0.1 micron of Au, 0.1 micron of Ni) and those consisting of aluminum and lead (0.1 micron of Al, 0.1 micron of Pb, 0.1 micron of Al) have also been found to mask completely at a diffusion of arsenic for, say, 2 minutes at 700° C. (arsenic 440° C.). In either case the breakdown voltage, after light etching, is approximately 0.3 volt.

The masking and sucking action may also be utilized when using a pre-diffused layer, as may appear from the following example: arsenic is diffused for 4 minutes at 650° C. into a p-type conductive germanium plate having a specific resistance of about 0.5 ohm-cm. at a surface concentration of $7\times19^{19}$/cm.$^3$ (source of arsenic at 440° C.), whereby an n-type layer of 0.6 micron thick is formed. An aluminum-indium ring of the same dimensions and composition as previously described with reference to FIGURES 2 to 6 is evaporation-deposited on the said layer and pre-alloyed at 700° C. up to a depth of about 1 micron. Then a considerable further diffusion of arsenic is carried out, namely for 4 minutes at 650° C., whilst the ring is again substantially molten and arsenic is supplied with a surface concentration of $7\times10^{19}$/cm.$^3$. The ultimate thickness of the diffusion layer is 0.9 micron and no diffusion of donor or at least no n-type conductive layer is perceptible under the melt or under the p-type conductive recrystallization layer produced therefrom. The breakdown voltage, after light etching, is still about 0.3 volt due to the sucking action of the melt. Now an example of the use of the delaying action will be described, which may be utilized very efficaciously in manufacturing p-n-p type transistors.

To this end, an Al-In layer 31 of 0.4 micron thick (at first 0.025 micron of In and then the remaining Al) is evaporation-deposited on a semi-conductor plate 30 (see FIGURE 7) of p-type germanium having a specific resistance of about 0.5 ohm-cm., whereafter said layer is alloyed at 700° C. for about 1 minute. Next, arsenic is diffused at a surface concentration of about $7\times10^{19}$/cm.$^3$ (arsenic at 440° C.) for about 20 minutes at about 800° C. during which process the front of the alloy melt penetrates the body up to the line 32, that is to say up to a depth of about 2 microns. After cooling, a p-type conductive recrystallization layer 33 is deposited from the melt, together with a contact 31. It appears that an n-type conductive layer 34 of about 2 microns thick has been formed below the recrystallization layer, whilst an adjoining n-type conductive layer 35 of about 10 microns thick has been simultaneously formed next to the melt, in other words the depth of penetration under the melt (31, 33) is only one fifth of that beside the melt. The resulting p-n-p type structure (33, 34 and 30) may be completed in the usual manner as a transistor by providing, for example, an annular contact 36 on a thick n-type conductive portion 35 of the base zone and limiting a transition 38 between the base zone (34 and 35) and the collector zone 30 by etching along the dashed lines 37. After removing a layer 39 from the underside, an ohmic contact may be provided on the collector zone in the usual manner.

Figure 7:
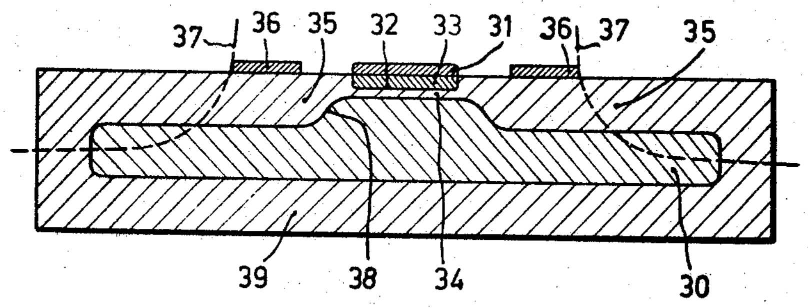
FIGURE 7 shows a cross-section of a manufacturing stage according to the invention of a semi-conductor body of another transistor.

The depth of penetration of the alloy melt or recrystallization layer and the extent of the delay are preferably chosen, as is also the case in the example of FIGURE 7, to be such that as measured from the initial semi-conductor surface, the base zone 34 under the alloy melt and the recrystallization layer 33 produced therefrom have penetrated the body to a smaller depth than a portion 35 of this zone located next to the recrystallization layer 33, so that a p-n transition 38 is locally bent towards the recrystallization layer. In fact, the decrease in resistance then becomes manifest very effectively and the spacing between the base contact and the collector zone, as measured along the surface, is considerably widened, while an extremely thin base zone can still be used in the active portion 34. Although this situation is preferably aimed at, it is without passing beyond the scope of the invention also possible to choose the depth of penetration of the recrystallization layer 33 and the delay to be such that the p-n transition 38 is in practice rectilinear or even bent from the recrystallization layer 33, as is the case for example if the depth of penetration of the recrystallization layer 33 is 2 microns, the portion 32 of the base zone is 1 micron thick and the portion 35 is 2 microns thick and thus a considerable delay of ½ is still used. With respect to the known allow-diffusion transistor in which the two portions 32 and 33 are equally thick, at least in so far diffused simultaneously, the improvement is yet obtained that the thickness outside the recrystallization layer is considerably greater due to the delay under the recrystallization layer 33.

The extent of the delay is adjustable by varying the thickness of the delaying layer of contact material, the temperature and duration of the diffusion, and the surface concentration of donor, while the depth of penetration of the recrystallization layer depends upon the thickness and the composition of the layer of contact material and the maximum temperature of alloying. In the transistor shown in FIGURE 7 it is possible, as previously stated in the example, also to use advantageously a high surface concentration of the donor, for example, of about $7\times10^{19}$/cm.$^3$, in which event a favourable emitter-base breakdown voltage of about 0.3 volt, after light etching, is still obtainable with germanium due to the sucking action.

Another special embodiment of the method according to the invention for the manufacture of a p-n-p type transistor on germanium will be described with reference to FIGURE 8.

Start is made from an n-type conductive germanium plate 41 having a specific resistance of, for example, 1 ohm-cm. and a thickness of, say, 100 microns. Arsenic is first diffused into the plate at a comparatively low surface concentration, for example of $10^{16}/cm.^3$. During diffusion, the plate 41 is heated at about 750° C. for about 20 minutes, resulting in an n-type conductive diffusion layer 42 of about 1.5 microns thick. A strip of an Al-In alloy 43 (7% by volume of In) of 0.3 micron thick, 100 microns long and 25 microns wide is now evaporation-deposited on the layer 42 and subsequently alloyed at 650° C., the depth of penetration of the front 44 of the melt being about 0.7 micron. Next a diffusion of arsenic is again carried out, during which process the ambient source of arsenic is heated to 440° C. and the concentration in the surface of the first-formed layer 42 is increased to about $7\times10^{19}/cm.^3$. During this diffusion, the layer 43 is again in the molten state up to the front 44 of the melt. The diffusion lasts about 3 minutes at 650° C., a surface layer 45 having a high n-type conductivity and about 0.6 microns thick being produced. Upon cooling, a p-type conductive recrystallization layer 46 is deposited from the melt due to the high segregation constant of aluminum, and finally the metallic contact 43. Due to the invention, during the further diffusion, substantially no diffusion of donor takes place from the ambience through the front 44 of the melt and despite the high surface concentration of $7\times10^{19}/cm.^3$ a favourable breakdown voltage between the emitter zone 45 and the base layer (42, 45) is obtained due to the sucking action, which breakdown voltage after light etching may be about 0.3 volt. The layer 45 may be provided in the usual manner, either simultaneously or afterwards, with a base contact, for example in the form of two equally large strips 47 consisting of Au-Ab alloy (2% of Sb) which makes a connection of low base resistance through the highly doped layer 45.

Figure 8:
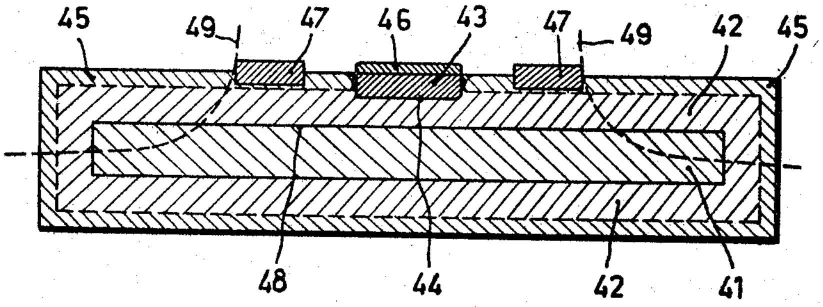
FIGURE 8 shows a cross-section of a manufacturing stage according to the invention of a semi-conductor body of yet another transistor.

The body thus treated as shown in FIGURE 8 may be treated further in the usual manner for obtaining a p-n-p type transistor. To this end, a collector transition 48 is limited by an etching treatment along the broken lines 49 while simultaneously masking the body at the strips 46 and 43 and between them, and the layers 42 and 45 at the underside are etched away to make an ohmic connection with the collector zone 41. If desired, a light after-etching treatment suffices since the breakdown voltage has a value of about 0.3 volt, which is already suitable for many uses, and for this reason it is not necessary to break by etching through the layer 45 around the emitter (43, 46) to obtain at least a reasonably high breakdown voltage or avoid short-circuit. The diffusion in two steps of which, according to the invention, the last diffusion step is carried out in the presence of the alloy melt affords, in addition to the advantages previously mentioned, the further advantage that the concentration gradient of the donor in the portion of the base zone located under the recrystallization layer 46 can be determined or chosen independently of the high surface concentration in the surface. Within the scope of the invention it is also possible to apply a high surface concentration already in the first diffusion step if thereafter a considerable diffusion of donor still takes place in the presence of the alloy melt to enable the melt to produce a transition layer having a decreased concentration of donor at the surface.

In the foregoing examples arsenic has always been used as the impurity. However, similar results can be obtained with other donors, such as antimony, although arsenic is preferable especially at high surface concentrations upwards of $10^{19}/cm.^3$.

Also with silicon analogous delay and masking effects can be obtained with acceptor-containing alloy melts, more particularly with aluminum. This may appear from the following experiment in which an Al-In alloy (7 atomic percent of In) was evaporation-deposited on a silicon plate of 2 mm. x 2 mm. x 200 micron of the p-type conductivity having a specific resistance of about 5 ohm-cm., which alloy covered the whole upper side except a cavity of about 300 microns diameter. The deposited layer was about 0.5 micron thick and was first alloyed in air at 690° C. for several minutes. Next the plate, together with an alloy of indium and phosphorus (5% by weight of P), is heated at 1050° C. for half an hour, the surface concentration of the phosphorus being about $10^{18}$ to $10^{19}$/ccs. The aluminum layer is in the molten state during diffusion. After cooling, it appears that an n-type conductive layer has been formed inside the cavity and not under the aluminum, such a layer being about 0.4 micron thick. It is found to extend at the centre of the cavity up to about 50 microns from the aluminum layer. A diode curve having a sharp breakdown at 30 volts was measured between this n-type conductive layer and the aluminum.

In conclusion, it is to be noted that manifold variations are possible for an expert within the scope of the invention. Thus, for example, the transistor designs shown in FIGURES 7 and 8 can be improved further by starting from a body having a $p^-$-$p^+$ structure instead of a homogeneous p-type conductive body, the highly conductive $p^+$ portion being a substrate on which the weakly conductive $p^-$ layer has grown epitaxially from the vapour phase. Said diffusion of donor can be carried out into the $p^-$ layer. In the design shown in FIGURES 1 to 6 other elongated shapes of the cavity can be used or the base contact can be annular and surround a cavity which is concentric therewith. The emitter zone can also be formed as an elongated layer next to an elongated base-contact strip or between two base-contact strips. In the embodiment shown in FIGURE 7 it is also possible to use an annular emitter 31 and provide one or more base contacts made and/or outside this ring. The method according to the invention is also applicable to the manufacture of a circuit built up in a semi-conductor body, which circuit includes a semi-conductor device of the kind mentioned in the preamble.

What is claimed is:

1. A method of making a double-diffused semiconductor device comprising diffusing into a semiconductor body region of n-type conductivity an acceptor impurity to form a surface layer of p-type conductivity and a p-n junction with the body region, establishing a melt of an acceptor-containing solvent metal on the p-type surface layer, which melt penetrates a given distance into the body, while said melt is present, diffusing into a solid part of the p-type surface layer, adjacent the melt, a donor impurity to a depth less than the thickness of the p-type layer and less than the depth of melt penetration to produce an n-type zone forming a p-n junction with the p-type surface layer, said metal melt including an element capable of combining with the donor to such a high degree that the diffused free donor concentration adjacent the melt is significantly lower than the donor concentration at a corresponding level elsewhere in the n-type zone, and cooling the assembly to solidify the melt forming an acceptor dominated p-type recrystallized region establishing an ohmic contact with the p-type layer.

2. A method as set forth in claim 1 wherein the contact metal is first alloyed to the body at the p-type surface layer at a relatively high temperature, and the donor is subsequently diffused at a lower temperature but sufficient to remelt the contact metal.

3. A method as set forth in claim 2 wherein the contact metal contains aluminum, the high temperature is at least about 700° C., and the lower diffusion temperature is between about 600° C. and 700° C., the donor employed being arsenic.

4. A method as set forth in claim 1 wherein the metal melt is in the form of an annulus, and the donor diffusion takes place into the body through the hole in the annulus.

5. A method of making a double-diffused n-p-n transistor comprising diffusing into a germanium body region of n-type conductivity an acceptor impurity to form a surface layer of p-type conductivity and a p-n collector junction with the body region, establishing an annular melt of a metal containing at least 30 atomic percent of aluminum on the p-type surface layer, which melt penetrates a given distance into the body, while said melt is present, diffusing from the ambience into a solid part of the p-type surface layer through the annular melt a donor impurity at such a concentration and to a depth less than the thickness of the p-type layer and less than the depth of the melt penetration to produce an n-type zone having a surface donor concentration of at least $10^{19}/cm.^3$ and forming a p-n emitter junction with the p-type surface layer, said aluminum content of said metal melt being capable of combining with the donor to such a high degree that the diffused free donor concentration adjacent the melt is significantly lower than the donor concentration at a corresponding level elsewhere in the n-type zone, and cooling the assembly to solidify the melt forming an acceptor dominated p-type recrystallized region establishing a base ohmic contact with the p-type layer.

6. A method as set forth in claim 5 wherein the contact metal consists substantially of aluminum.

7. A method as set forth in claim 5 wherein the contact metal consists essentially of aluminum and up to 10 atomic percent of indium.

8. A method as set forth in claim 5 wherein the diffusing acceptor exhibits a relatively slow diffusion rate, and the initial body region exhibits n-type conductivity by reason of the presence of a donor impurity exhibiting a relatively fast diffusion rate.

References Cited

UNITED STATES PATENTS

| | | | |
|---|---|---|---|
| 2,974,072 | 3/1961 | Genser | 148—180 |
| 3,010,855 | 11/1961 | Barson et al. | 148—180 |
| 3,078,397 | 2/1963 | Tummers et al. | 148—185 |
| 3,242,014 | 3/1966 | Takagi et al. | 148—1.5 |

DAVID L. RECK, *Primary Examiner.*

HYLAND BIZOT, *Examiner.*

R. O. DEAN, *Assistant Examiner.*

UNITED STATES PATENT OFFICE
CERTIFICATE OF CORRECTION

Patent No. 3,333,997 August 1, 1967

Pieter Johannes Wilhelmus Jochems et al.

It is hereby certified that error appears in the above numbered patent requiring correction and that the said Letters Patent should read as corrected below.

Column 10, line 74, for "p-n-p" read -- n-p-n --.

Signed and sealed this 29th day of October 1968.

(SEAL)
Attest:

Edward M. Fletcher, Jr.
Attesting Officer

EDWARD J. BRENNER
Commissioner of Patents